United States Patent [19]

Calviello

[11] 4,075,650
[45] * Feb. 21, 1978

[54] MILLIMETER WAVE SEMICONDUCTOR DEVICE

[75] Inventor: Joseph A. Calviello, Kings Park, N.Y.

[73] Assignee: Cutler-Hammer, Inc., Milwaukee, Wis.

[*] Notice: The portion of the term of this patent subsequent to May 27, 1992, has been disclaimed.

[21] Appl. No.: 675,621

[22] Filed: Apr. 9, 1976

[51] Int. Cl.² .............................................. H01L 29/48
[52] U.S. Cl. .......................................... 357/15; 357/56
[58] Field of Search ...................... 357/56, 15, 52, 13, 357/14

[56] References Cited

U.S. PATENT DOCUMENTS

| | | | |
|---|---|---|---|
| Re. 28,653 | 12/1975 | Murphy | 357/56 |
| 3,387,189 | 6/1968 | Anderson et al. | 357/14 |
| 3,615,929 | 10/1971 | Portnoy et al. | 357/56 |
| 3,756,924 | 9/1973 | Collins et al. | 204/15 |
| 3,761,783 | 9/1973 | Kroger et al. | 357/56 |
| 3,820,236 | 6/1974 | Haitz | 357/15 X |
| 3,886,580 | 5/1975 | Caviello | 357/15 |
| 3,896,473 | 7/1975 | DiLorenzo | 357/15 |
| 3,986,142 | 10/1976 | Kim | 357/13 X |

OTHER PUBLICATIONS

S. Sze, *Physics of Semiconductor Devices,* Wiley-Interscience, © 1969, pp. 364-367.

*Primary Examiner*—Stanley D. Miller, Jr.
*Assistant Examiner*—James W. Davie
*Attorney, Agent, or Firm*—Kevin Redmond

[57] ABSTRACT

A mesa semiconductor device, including a metal film conductor located on the upper surface of the device about the base of the mesa to reduce skin effect loss.

6 Claims, 4 Drawing Figures

MILLIMETER WAVE SEMICONDUCTOR DEVICE

BACKGROUND

1. Field

This invention relates to improvements in high frequency semiconductor devices and particularly to improvements in the reduction of skin effect loss in millimeter wave semiconductor diodes.

2. Prior Art

The flow of an alternating current in a conductor produces a field that tends to constrain the current to a region near the surface or "skin" of the conductor. This characteristic, generally known as the skin effect, induces a loss that is present to some extent to all frequencies, but is particularly noticeable at microwave and higher frequencies. At frequencies where the skin effect can be neglected, the current is generally evenly distributed throughout the cross section of a conductor. At frequencies where the skin effect cannot be neglected, the current is forced to flow through the relatively narrow cross section of the "skin" and along surface paths that often increase the total path length and the loss.

The term N doped material, as used herein, refers to extrinsic semiconductor material in which the electron carrier concentration exceeds the mobile hole concentration. N+ material refers to N doped material in which the electron carrier concentration is high. P material refers to material in which the hole carrier concentration exceeds the electron concentration and P+ refers to material in which the mobile hole carrier concentration is high. The carrier concentration in P or N material ranges from about $10^{16}$ to $5 \times 10^{17}$ per cubic centimeter, whereas the carrier concentration in P+ or N+ material ranges from about $1 \times 10^{18}$ to $1 \times 10^{19}$ per cubic centimeter. Materials with high carrier concentrations such as N+ and P+ materials have relatively low resistivity and conversely materials with low carrier concentrations such as N and P materials have relatively high resistivity. The exact relationship between the resistivity and the carrier concentration for various material may be found in a number of publications including S.M. Sze, "Physics of Semiconductors," Wiley Interscience, New York, 1969.

FIG. 1 is a cross sectional view of a prior art silicon planar diode showing the current paths through the diode at both low and millimeter wave frequencies. In this device, a semiconductor junction 3 is formed at the interface of a P doped layer 2 and an N doped layer 4. The N doped layer contacts a body of N+ material 7 at a second interface 6. A first electrode 1 makes contact with the upper surface of the P layer. A second electrode 8 makes contact with the N+ body on the lower surfaces of the device. A silicon dioxide passivation layer 15 protects a portion of the upper surface of the N layer about the junction.

The current flow through the diode from the junction to the second electrode at low frequencies is represented by a current path $I_o$, identified by drawing numeral 14. The current flow at millimeter frequencies is represented by current paths $I_1$ through $I_5$, identified by drawing numeral 9 through 13 respectively.

The term "skin depth" refers to the depth in a material at which the field strength is 37 percent of that at the surface. The skin depth in FIG. 1 is represented by dimension line 5. The current path $I_1$ shows the depth of penetration of the initial downward flow of the current immediately beneath the junction to be approximately one skin depth.

After the initial downward flow of the current through the N layer into the N+ material the current direction changes towards the sides of the diode, as shown by the $I_2$ current path. After leaving the junction area, the current follows a path along the surface of the diode. $I_3$, $I_4$ and $I_5$ represent the current paths along the diode upper surface, sides and lower surface, respectively. Symbols $R_1$ through $R_5$ represent the values of resistance in paths $I_1$ through $I_5$, respectively. The diode resistance from the junction to the second contacting layer is the sum of $R_1$ through $R_5$.

At low frequencies, the skin effect is negligible and the current flow is generally in a direct path from the junction through the N layer and N+ body to the second electrode. Although the current at these frequencies emanates from the entire undersurface of the junction, it is represented in FIG. 1, for the sake of clarity, by a single current path line 14.

The path length through the N and N+ materials at low frequencies is short, as can be seen from the $I_o$ path in FIG. 1. However, at millimeter wave frequencies, this short path is replaced by the much longer $I_1$ through $I_5$ paths. This longer path length and the relatively small cross sectional area of the skin combine to produce a high skin effect loss in planar devices.

The device loss can be further increased by the fringing capacitance. This is the capacitance between the first electrode and the upper semiconductor layer of the device, such as the N layer in FIG. 1. It produces a factor that multiplies the diode series resistance.

For low loss operation at millimeter wave frequencies, the fringing capacitance must be kept to a minimum. Unfortunately, the planar diode of FIG. 1 does not exhibit a low fringing capacitance. In this device, the first electrode extends beyond the P layer over the N layer, with only a thin layer of silicon dioxide separating the two. This structure is in effect a parallel plate capacitor that produces a relatively high value of fringing capacitance and a correspondingly high value of equivalent series resistance.

A method of reducing the skin effect loss in millimeter wave diodes is described by Anderson et al., in U.S. Pat. No. 3,387,189. A cross sectional view of the Anderson device is shown in FIG. 2. The Anderson device is similar to the device shown in FIG. 1 in that it is a planar diode, but there are several important differences. The silicon dioxide passivation on the Anderson device extends only a short distance from the first electrode. The remaining areas on the upper surface and sides of the device are covered by a metal film conductor 16. Although the metal film conductor is shown in FIG. 2 as comprising a single material, this film may, in a practical device, include a contacting layer of one material and an electrode layer of a different material. The purpose and composition of these layers is explained in more detail in the description of the devices shown in FIGS. 3 and 4. The P layer in the Anderson device is diffused into the N layer at least one skin depth, as shown by dimension line 5 in FIG. 2. This diffusion depth represents a significant increase in the thickness of the P layer over the device shown in FIG. 1.

In the operation of the Anderson device at millimeter wave frequencies, the initial flow of current from the junction, represented by paths $I_1$ and $I_2$, is similar to that shown in FIG. 1. However, the path represented by $I_3$ in FIG. 1 is changed in FIG. 2. The equivalent current flow in the Anderson device starts at the edge of the junction and then flows upward towards the metal film conductor 16. This new current path is designated $I_3'$ and is identified in FIG. 2 by drawing numeral 12. The resistance associated with the $I_3'$ path is represented by the symbol $R_3'$. This resistance includes the contact resistance at the interface of the semiconductor material and the metal film 16. The total resistance from the junction to the metal film conductor is the sum of $R_1$, $R_2$ and $R_3'$.

The principal purpose of the Anderson design is to reduce the skin effect loss. The metal film conductor on the diode surface does provide a lower resistance path for the current than is provided by the semiconductor material, but there are a number of factors in the Anderson design that tend to negate the advantage of the metal film conductor. These factors include high fringing capacitance, high contact resistance at the interface of the metal film and the N layer, and an increase in portions of the current paths through the P and N layers.

There is no improvement in the Anderson device over the planar device shown in FIG. 1 in reducing the fringing capacitance. As a result, the high fringing capacitance and high loss associated with this capacitance in planar devices remain present in the Anderson device. The metal film conductor makes contact with the N layer rather than with the N+ material. The resulting contact resistance is relatively high. The increased diffusion depth of the P layer requires the current to flow through a relative long path in the high resistance P and N layers before it reaches the metal film conductor, thereby increasing the diode series resistance.

In addition to these factors, the silicon planar structure of the Anderson device exhibits other undesirable characteristics including susceptible to accelerated degradation, premature breakdown and unsatisfactory performance in detector and mixer application. The silicon dioxide passivation of the planar structure is susceptible to sodium ion migration, an important factor in accelerating device degradation. High fields produced at the periphery of the junction in planar devices result in premature breakdown and early device failure. The capacitance formed by the N layer and the extension of the junction electrode over the silicon dioxide layer, as shown in FIGS. 1 and 2, result in charge accumulation at the interface of the silicon dioxide coating and the N layer. This charge accumulation modifies the space charge distribution, tending to make device performance unpredictable. Finally, storage capacitance in the P layer produced by minority carrier injection prevents successful use of the Anderson device in mixer and detector application.

Many of the semiconductor materials and fabrication techniques currently available were not available, in a practical sense, at the time the Anderson device was developed. The Anderson design is based on the materials and techniques available at the time it was developed and therefore this device cannot be considered as optimum by present day standards. For example, the silicon material of the Anderson device is not optimum for high frequency applications because of its relatively high resistivity. Gallium arsenide is preferred for this type of application because of its lower resistivity. However, until recently gallium arsenide was not widely used because of problems encountered in providing a satisfactory passivation coating and an economically practical gold diffusion shield. A method of overcoming these problems is now available and is described in my U.S. Pat. No. 3,923,975.

SUMMARY

The primary object of the present invention is to provide a reliable, low loss millimeter wave semiconductor device suitable for use in mixer, detector and varactor applications. In the present invention, the lossy planar structure of the prior art is replaced by a mesa structure that includes a first electrode on the upper surface of the mesa and a second electrode on the body of the device about the base of the mesa. The second electrode is a metal film conductor designed to provide a low impedance path for the current on the surface of the device at millimeter wave frequencies. However, unlike prior art devices, the second electrode makes a low resistance contact to the N+ semiconductor material.

The mesa structure of the present invention reduces loss by reducing the fringing capacitance and improves reliability by reducing the fringing fields. Further reductions in loss and improvements in reliability are obtained in a preferred embodiment of this invention that incorporates gallium arsenide as the semiconductor material. The lower resistivity of the gallium arsenide reduces device loss and a native oxide of gallium arsenide provides a passivation layer that is resistant to sodium ion migration.

DRAWING

DETAILED DESCRIPTION OF THE INVENTION

The present invention comprises a mesa diode with a metal film conductor on its upper surface about the base of the mesa to reduce skin effect loss at millimeter wave frequencies. Devices fabricated in accordance with this invention are useful in low loss mixer, detector and varactor applications.

Figure 3:
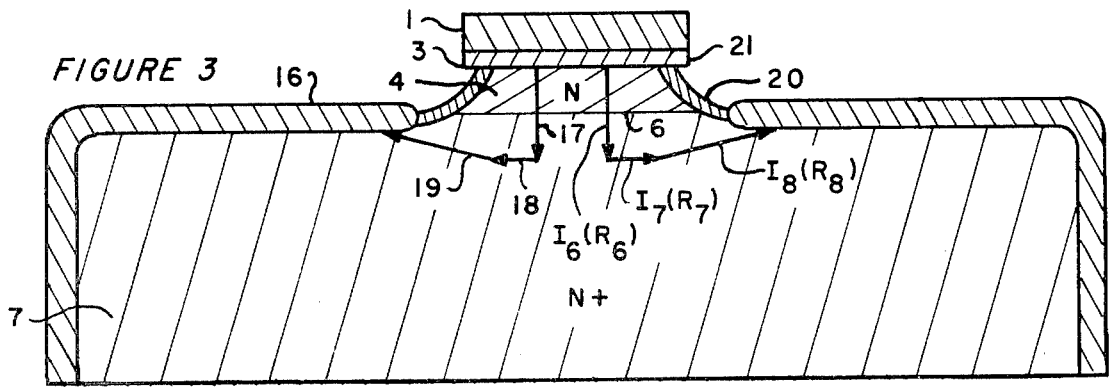
FIG. 3 is a cross sectional view of a diode illustrating the basic structure of the invention.

Referring to the basic embodiment shown in FIG. 3, a diode junction 3 is formed at the interface of an N layer 4 and a first contacting layer 23. A first electrode 1, usually a layer of gold, makes contact with the upper surface of the first contacting layer. The N layer is a short mesa structure that is joined to a body of N+ material 7 at a second interface 6. The first contacting layer extends slightly beyond the mesa along the plane of the junction to produce an overhanging section. The surface of the mesa intersects the overhanging section at an angle of approximately 90°. A metal film conductor 16 covers the upper surface and sides of the N+ material. The surface of the semiconductor material between the first contacting layer and the metal film conductor is protected by a passivation layer 20.

The first contacting layer 23 may be either a semiconductor material to form a P-N junction or a conductor to form a Schottky barrier junction. In FIG. 3, the body is shown as N doped material. This choice of doping is somewhat arbitrary. N doped material has been selected in FIGS. 3 and 4 for illustrative purposes. The body may be either N or P doped material as long as the contacting layer is made of material appropriate to form either a Schottky or P-N junction.

The current flow through the diode at millimeter wave frequencies is represented by current paths $I_6$ through $I_8$. The current path $I_6$ shows the initial downward flow immediately beneath the junction through the N layer and into the N+ material. After penetrating the N+ material, the direction of the current changes toward the sides of the diode, as shown by the $I_7$ current path. At the edge of the junction, the current direction again changes and the current flows upward towards the metal film conductor 16, as shown by the $I_8$ current path. Symbols $R_6$ through $R_8$ represent the values of resistance in paths $I_6$ through $I_8$, respectively. The total diode resistance from the junction to the second electrode is the sum of $R_6$ through $R_8$.

It can be seen in FIG. 3 that the only current path through the N layer is the $I_6$ path. The portion of this path that is contained within the N layer is significantly shorter and lower in resistance than the comparable portions of the $I_1$ and $I_3'$ paths contained within the N layer of the device shown in FIG. 2. The remaining $I_7$ and $I_8$ paths in the present invention are all in the low resistivity N+ material.

Figure 1:
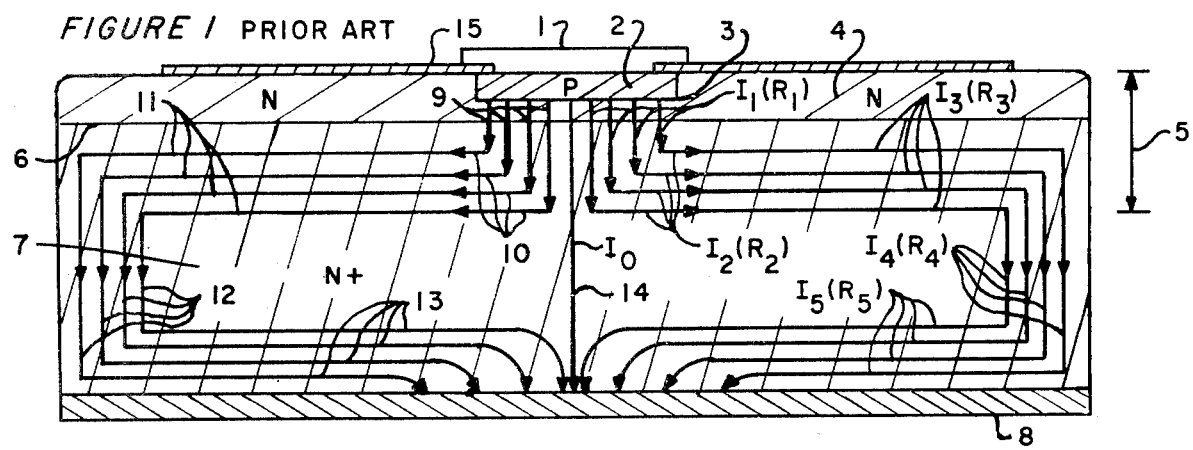
FIG. 1 is a cross sectional view of a prior art planar diode.
Figure 2:
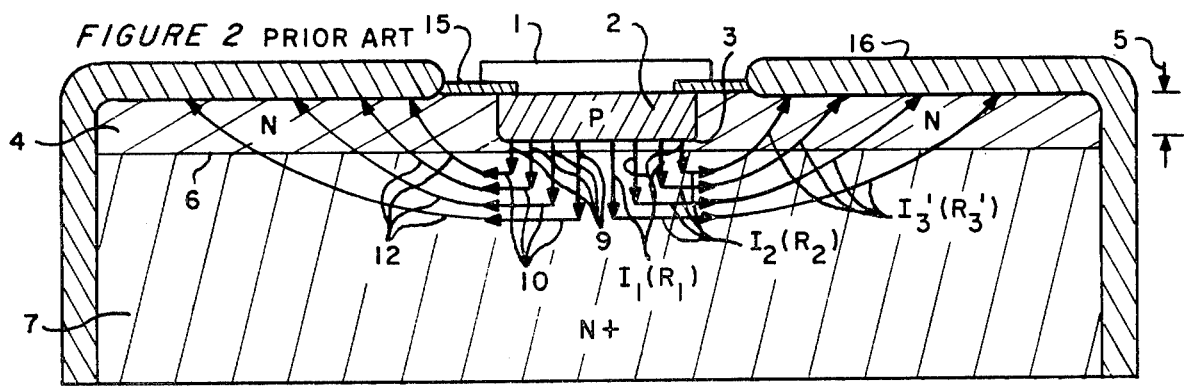
FIG. 2 is a cross sectional view of a prior art planar diode that includes a metal film conductor on its upper surface and sides.

In the prior art device of FIG. 2, the metal film conductor 16 overlays the N material, where a high resistance contact is made to the semiconductor material. In the present invention, the metal film conductor 16 overlays the N+ material, where a low resistance contact is made.

The separation of the first electrode from the N layer in the mesa structure of FIG. 3, reduces the fringing capacitance and fringing fields. As a result, the equivalent diode resistance and the destructive effect of the fringing fields are reduced. The separation of the first electrode from the N layer also reduces the charge accumulation about the edge of the junction and thus reduces the distortion of the space charge distribution, making the device performance more predictable.

The overhanging section of the contacting layer 21 and the right angle intersection of the mesa with this section aid in reducing the field stress at the periphery of the junction and thus improve device reliability.

Figure 4:
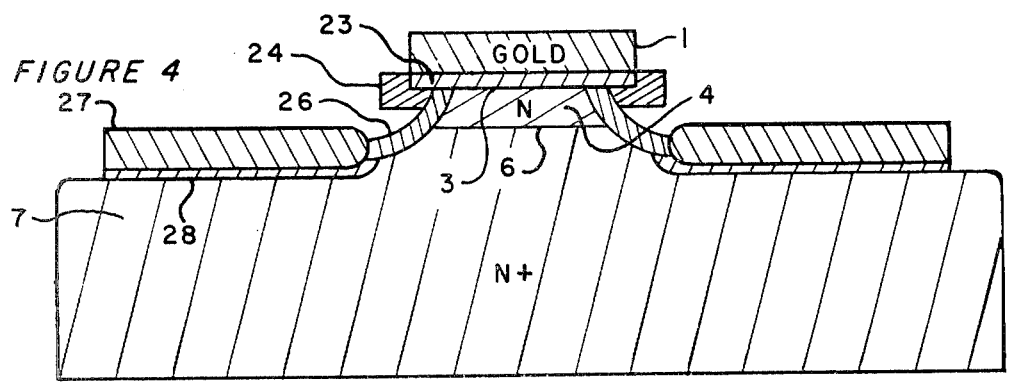
FIG. 4 is a cross sectional view of a preferred embodiment of the invention.

FIG. 4 shows a preferred embodiment of the invention comprising a gallium arsenide body and a Schottky barrier junction. An interface between a first contacting layer of tantalum 23 and a mesa of epitaxial N doped semiconductor material 4 defines the Schottky junction 3. A first gold electrode 1 covers the upper surface of the tantalum layer. The lower surface of the N layer joins a body of N+ material 7 at a second interface 6. A portion of the upper surface of the N+ body is covered with a second contacting layer 28. A second gold electrode layer 27 covers the upper surface of the second contacting layer. Layers 27 and 28 comprise the equivalent of the metal film conductor 16 in FIGS. 2 and 3. For continuous high temperature applications, the metal film conductor may also contain a third layer of a metal such as tantalum, molybdenum, or tungsten located between the electrode and the contacting layer to act as a gold diffusion shield. The surface of the semiconductor material between the first and second contacting layers is protected by a native oxide layer 26. The outer edge of the tantalum layer 23 is protected by a coating of tantalum oxide 24.

The term "native oxide" is used herein to denote the oxide that is produced by immersing gallium arsenide in a solution of hydrogen peroxide for a period of time that depends on the desired thickness of the oxide layer and the impurities in the peroxide. Usually a 1000 to 2000A layer is satisfactory and can be produced in as little as 4 hours. This process also can be used to produce the protective oxide coating on the tantalum layer.

The type of material chosen for the second contacting layer determines the type of contact made to the body of the device. A material such as germanium gold or silver tin produces an ohmic contact, whereas a material such as tantalum produces a semiconductor junction contact. A junction contact may be used in varactor applications where the diode junction located on the mesa is reversed biased, while the second contacting layer junction is forward biased. The forward biased junction merely serves to make electrical contact to the body of the device.

The area covered by the second contacting layer may be adjusted for the particular application. For example, in devices designed for varactor applications, the area covered is generally kept to a minimum to reduce the total diode capacitance.

The choice of a Schottky junction for the preferred embodiment eliminates the P doped semiconductor layer found in prior art P-N junction devices. In this embodiment of the invention, the current flows directly from the first electrode into the N layer, eliminating the loss of the P layer. The elimination of the P layer also eliminates the storage capacitance caused by minority carrier injection, enabling this device to be used successfully in mixer and detector applications.

The choice of gallium arsenide as the semiconductor material for the preferred embodiment provides a number of advantages. The lower resistivity of this material reduces the value of $R_6$ through $R_8$ and thus reduces the total diode series resistance. The reduction in series resistance results in improved circuit performance that can be measured by the value of the zero bias cutoff frequency. The zero bias cutoff frequency is a figure of merit defined in the following equation:

$$f_c(0) = \frac{1}{2\pi R\, C(0)}$$

In this expression, $f_c(0)$ is the zero bias cutoff frequency, $R$ is the equivalent diode series resistance and $C(0)$ is the zero bias depletion layer capacitance. The zero bias cutoff frequency indicates the frequency range in which a diode may be expected to provide relatively low loss performance. Gallium arsenide devices fabricated in accordance with this invention exhibit zero bias cutoff frequencies of 1000 GHz as compared to values of less than 700 GHz for more conventional devices.

The efficient operating range of a device is usually below one-third its cutoff frequency. In a particular application, a device with the highest cutoff frequency will usually provide the best efficiency. For example, a diode with a cutoff frequency of 650 GHz, operating in a frequency doubler circuit, provides an output power of 10 mW at 200 GHz with an efficiency of 7 percent. A device fabricated in accordance with the present invention with a cutoff frequency of 1000 GHz operating in the same circuit provides an output power of 18 mW at an efficiency of 12 percent.

In addition to improving the circuit performance, gallium arsenide also improves device reliability. Unlike silicon dioxide, the native oxide of gallium arsenide is resistant to sodium ion migration. As the method of producing native oxide is carried out at relatively low temperatures, the possibility of damage encountered in prior art high temperature passivation techniques is avoided. The reliability achieved with gallium arsenide devices passivated with native oxide and configured in accordance with the mesa structure of FIGS. 3 and 4 is exemplified by the results of a life test carried out on 40 units at a temperature of 200° C. After 17,000 hours, there have been no failures.

I claim:

1. A gallium arsenide microwave semiconductor device, comprising:
    (a) a body of N+ doped gallium arsenide semiconductor material with a carrier concentration in the range of about $1 \times 10^{18}$ to $1 \times 10^{19}$ per cubic centimeter,
    (b) a mesa located on the upper surface of the body and formed of N doped gallium arsenide at a carrier concentration in the range of about $1 \times 10^{16}$ to $5 \times 10^{17}$ per cubic centimeter,
    (c) a first contacting layer of tantalum in contact with the upper surface of the mesa to form a Schottky barrier diode junction at the interface of the contacting layer and the mesa, said first contacting layer extending along the plane of the upper surface of the mesa beyond the periphery of the Schottky junction, and the surface on the side of the mesa adjacent the Schottky junction being approximately perpendicular to the plane of the upper surface of the mesa,
    (d) a second contacting layer located substantially in a plane below the plane of the upper surface of said mesa with a thickness of at least one skin depth at the operation frequency in contact with and extending over at least a portion of the upper surface of the body about the base of the mesa,
    (e) a first electrode connected to and extending over the upper surface of the first contacting layer,
    (f) a second electrode connected to and extending over the upper surface of the second contacting layer,
    (g) the exposed edge of said first contacting layer passivated with tantalum oxide, and
    (h) the surface of the device between the first and second electrode passivated with native oxide.

2. A device as claimed in claim 1, wherein said first and second electrodes are of gold.

3. A device as claimed in claim 1, wherein the second contacting layer is a conductor to form a Schottky barrier junction at the interface of the second contacting layer and the body.

4. A device as claimed in claim 3, wherein the second contacting layer consists of tantalum.

5. A device as claimed in claim 1, wherein the contact between said second contacting layer and said body is ohmic.

6. A device as claimed in claim 5, wherein said second contacting layer consists of germanium gold.

* * * * *